United States Patent
Lin et al.

(10) Patent No.: US 7,842,946 B2
(45) Date of Patent: Nov. 30, 2010

(54) ELECTRONIC DEVICES WITH HYBRID HIGH-K DIELECTRIC AND FABRICATION METHODS THEREOF

(75) Inventors: Wei-Ling Lin, I-Lan Hsien (TW); Jiing-Fa Wen, Taipei (TW); Wen-Hsi Lee, Kaohsiung (TW); Tarng-Shiang Hu, Hsinchu (TW); Jiun-Jie Wang, Kaohsiung (TW); Cheng-Chung Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/849,460

(22) Filed: Sep. 4, 2007

(65) Prior Publication Data

US 2008/0149922 A1    Jun. 26, 2008

(30) Foreign Application Priority Data

Dec. 25, 2006   (TW) .............................. 95148763 A

(51) Int. Cl.
*H01L 29/08* (2006.01)
(52) U.S. Cl. .......... 257/40; 257/E51.007; 257/E51.013; 438/591; 349/51

(58) Field of Classification Search ................... 257/40, 257/E51.007, E51.013; 438/591; 349/51
See application file for complete search history.

(56) References Cited

U.S. PATENT DOCUMENTS

| | | | |
|---|---|---|---|
| 6,433,359 B1 | 8/2002 | Kelley et al. | |
| 6,558,987 B2 | 5/2003 | Lee | |
| 6,563,174 B2 | 5/2003 | Kawasaki et al. | |
| 6,586,791 B1 | 7/2003 | Lee et al. | |
| 7,005,674 B2 * | 2/2006 | Lee et al. | 257/40 |
| 7,029,945 B2 * | 4/2006 | Veres et al. | 438/99 |
| 7,170,093 B2 * | 1/2007 | Wu et al. | 257/59 |
| 7,456,424 B2 * | 11/2008 | Wu et al. | 257/40 |
| 7,459,721 B2 * | 12/2008 | Nakamura | 257/40 |
| 2006/0180809 A1 | 8/2006 | Park et al. | |
| 2006/0214154 A1 * | 9/2006 | Yang et al. | 257/40 |

* cited by examiner

*Primary Examiner*—David Vu
*Assistant Examiner*—Brandon Fox

(57) ABSTRACT

Electronic devices with hybrid high-k dielectric and fabrication methods thereof. The electronic device includes a substrate. A first electrode is disposed on the substrate. Hybrid high-k multi-layers comprising a first dielectric layer and a second dielectric layer are disposed on the substrate, wherein the first dielectric layer and the second dielectric layer are solvable and substantially without interface therebetween. A second electrode is formed on the hybrid multi-layers.

11 Claims, 5 Drawing Sheets

ELECTRONIC DEVICES WITH HYBRID HIGH-K DIELECTRIC AND FABRICATION METHODS THEREOF

BACKGROUND OF THE INVENTION

1. Field of the Invention

The invention relates to electronic devices with a high dielectric constant (high-k) dielectric layer, and in particular to electronic devices with high-k dielectric including combinations of organic and/or inorganic hybrid high-k dielectric material and fabrication methods thereof.

2. Description of the Related Art

Operation of a field effect transistor (FET) is due to enough charges being induced at the interface between the semiconductor and gate insulating layer. In order to generate high current $I_D$ at low operating voltage, the FET requires high carrier mobility in its semiconductor layers, high width-to-length ratio of its channels as well as high capacitance of the FET structure. High capacitance of the FET structure depends on the thickness and dielectric constant (k) of the gate insulating layer. A thinner high-k gate insulating layer results in a high current $I_D$ at low operating voltage, thereby reducing power consumption.

U.S. Pat. No. 6,586,791, the entirety of which is hereby incorporated by reference discloses a method for forming a gate insulating layer. A suspension solution is prepared by dispensing nano-scale ceramic particles in a polymer solution. The suspension solution is then applied on a substrate by spin coating, thus forming a gate insulating layer. The gate insulating layer prepared by the conventional method, however, suffers from rough surfaces, strip defects and unevenness, resulting in high leakage in electronic devices during operation.

FIG. 1 is a cross section of a conventional organic thin film transistor (OTFT) device formed by dispensing nano-scale ceramic particles in a polymer solution. Referring to FIG. 1, an OTFT includes a heavily doped silicon substrate 10 with a metal layer 15 disposed thereon to served as a gate electrode. An insulating layer 20 is formed on the heavily doped silicon substrate 10. A source region 25 and a drain region 30 separated by a predetermined distance are formed on the insulating layer 20. An organic semiconductor layer 35 is disposed on the heavily doped silicon substrate 10 and covers the source region 25, the drain region 30, and the region therebetween. Since the insulating layer 20 is typically formed by spin coating a suspension solution and dispensing nano-scale ceramic particles in a polymer solution, the insulating layer 20 suffers from rough surfaces, strip defects and unevenness, i.e., the peak-to-valley can reach 0.3 µm for film thicknesses less than 0.6 µm, resulting in high leakage in the electronic device during operation.

U.S. Pat. No. 6,558,987, the entirety of which is hereby incorporated by reference discloses a thin film transistor (TFT) device and fabrication methods thereof. Two dielectric layers are used as a gate dielectric of a conventional TFT device. Both dielectric layers such as silicon nitride ($SiN_x$) or silicon oxide ($SiO_x$) respectively, are inorganic materials deposited by chemical vapor deposition (CVD). After a first dielectric layer is deposited, contaminant residue on the first dielectric layer is cleaned. A second dielectric layer is then deposited on the first dielectric layer to avoid defect generation.

U.S. Pat. No. 6,563,174, the entirety of which is hereby incorporated by reference discloses two high-k dielectric layers used as a gate dielectric of the conventional TFT device, wherein a first dielectric layer is typically silicon nitride ($SiN_x$), while the second dielectric layer is a metal oxide such as $BaTiO_3$, $CaZrO_3$, or $SrSnO_3$. The second dielectric layer improves crystallinity of the semiconductor layer (e.g., ZnO) to improve carrier mobility of the TFT devices.

U.S. Pat. No. 7,005,674, the entirety of which is hereby incorporated by reference discloses an organic thin film transistor (OTFT) structure and fabrication method thereof. Two organic dielectric layers are used as a gate dielectric of the OTFT device, wherein the first dielectric layer is a high-k dielectric layer, and the second dielectric layer is a polymer covering the first dielectric layer, thereby matching the semiconductor of the OTFT device and improving performance of the device.

FIG. 2 is a cross section of another conventional organic thin film transistor (OTFT) device. Referring to FIG. 2, an organic thin film transistor includes a substrate 50 with a gate electrode 55 thereon. A first insulating layer 60 is disposed on the substrate 50 covering the gate electrode 55. A second insulating layer 65 is disposed on the first insulating layer 60. An organic semiconductor layer 70 is disposed on the second insulating layer 65. A source region 80 and a drain region 90 separated by a predetermined distance are formed on the organic semiconductor layer 70. Although the second insulating layer can improve original interface properties between the organic semiconductor layer 70 and the high-k first dielectric layer 65, due to the rough interface between the second insulating layer 65 and the first insulating layer 60, high leakage for electronic devices during operation often occur. Thus, decreasing performance efficiency.

The aforementioned conventional OTFT devices include a two-layered dielectric structure as the gated dielectric layer of the OTFT device. The dielectric constant of the second dielectric layer is typically lower than that of the first dielectric layer such that increasing the dielectric constant is limited. Thus, limiting applications of the OTFT devices.

BRIEF SUMMARY OF THE INVENTION

A detailed description is given in the following embodiments with reference to the accompanying drawings.

The invention relates to a fabrication method for electronic devices with high-k dielectric layers by a solution process. Dispersion of nano-scale high-k particles in polymer solution is improved, thus improving surface condition of the high-k dielectric layer and enhancing electronic device performance. The second dielectric layer of the electronic device is formed by a solution process on the first dielectric layer such that an invisible interface substantially exists between the first and the second dielectric layers, thereby preventing high leakage in electronic devices during operation.

An embodiment of the invention provides an electronic device with hybrid high-k dielectric, comprising: a substrate; a first electrode disposed on the substrate; a hybrid multi-layers comprising a first dielectric layer and a second dielectric layer disposed on the substrate, wherein the first dielectric layer and the second dielectric layer are solvable and substantially without an interface therebetween; and a second electrode is disposed on the hybrid multi-layers.

Another embodiment of the invention further provides a method for manufacturing an electronic device with hybrid high-k dielectric. A substrate is provided. A first electrode is formed on the substrate. A first dielectric layer and a second dielectric layer are sequentially formed creating hybrid multi-layers, wherein the first dielectric layer and the second dielectric layer are solvable and substantially without an interface therebetween. A second electrode is formed on the hybrid multi-layers.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the mode of carrying out the invention. This description is made for the purpose of illustrating the general principles of the invention and should not be taken in a limiting sense. The scope of the invention is best determined by reference to the appended claims.

Embodiments of the invention provide applying a solvable second dielectric layer on the first dielectric layer to create an organic/inorganic hybrid high-k dielectric layer which improves dispersion of nano-scale high-k particles in a polymer solution and surface roughness of the hybrid high-k dielectric layer, thereby enhancing performance of a device. An exemplary electronic device with hybrid high-k dielectric multi-layers of the invention comprises a substrate, a first electrode disposed on the substrate, a hybrid multi-layers comprising a first dielectric layer and a second dielectric layer disposed on the substrate, wherein the first dielectric layer and the second dielectric layer are solvable and substantially without an interface therebetween, and a second electrode disposed on the hybrid multi-layers. Examples of the electronic device comprise a field effect transistor, an organic thin film transistor (OTFT), an inorganic thin film transistor, or a metal-insulator-metal (MIM) capacitor.

Figure 1:
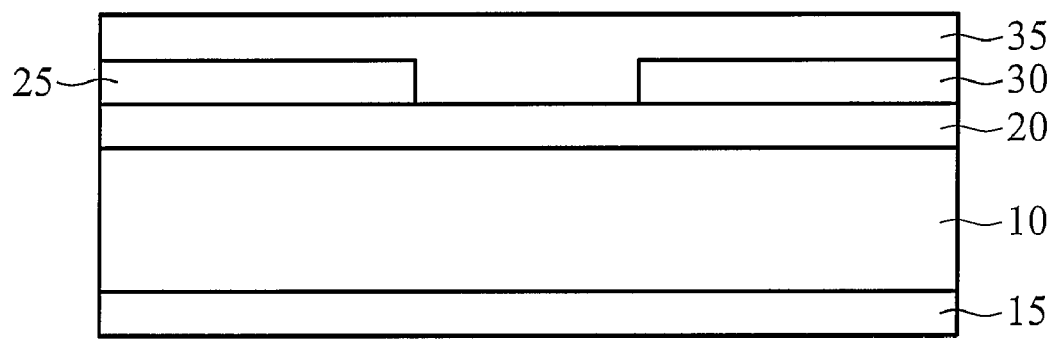
FIG. 1 is a cross section of a conventional organic thin film transistor (OTFT) device formed by dispensing nano-scale ceramic particles in polymer solution.
Figure 2:
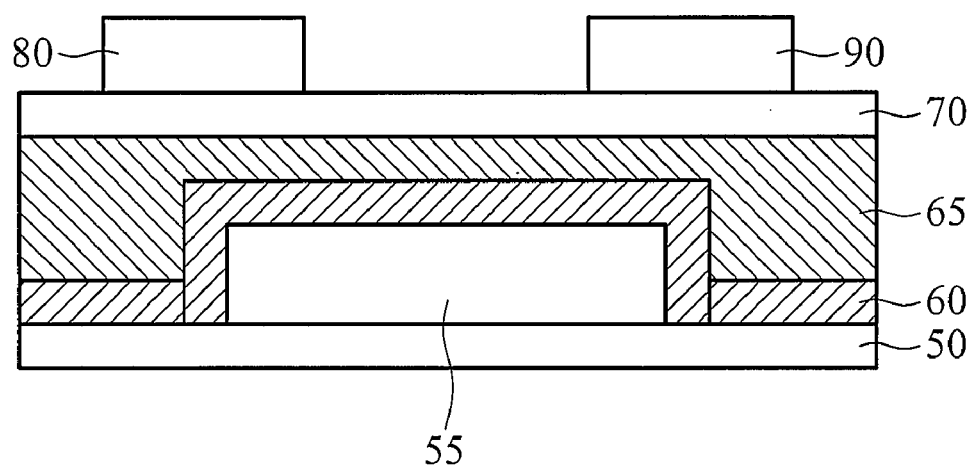
FIG. 2 is a cross section of another conventional organic thin film transistor (OTFT) device.
Figure 3A:
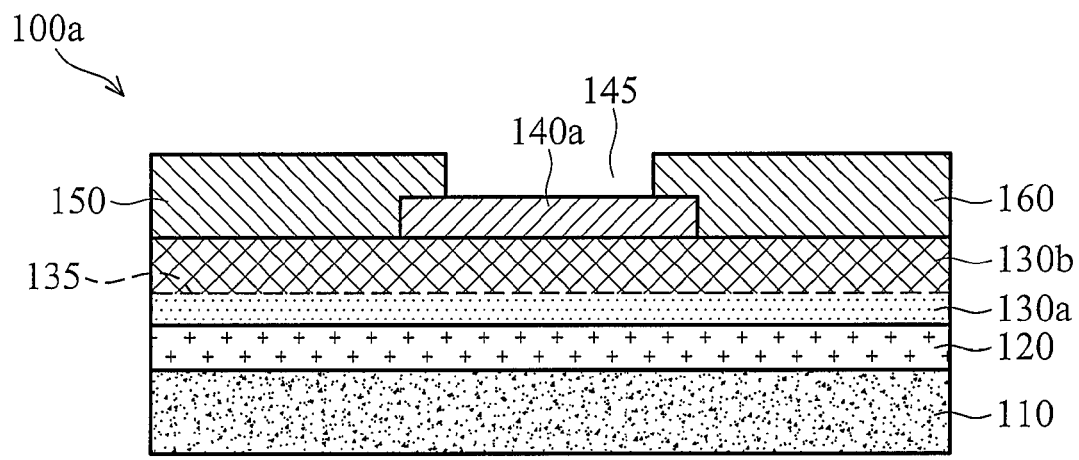
FIGS. 3A-3B are cross sections of an exemplary embodiment of OTFT devices of the invention.
Figure 3B:
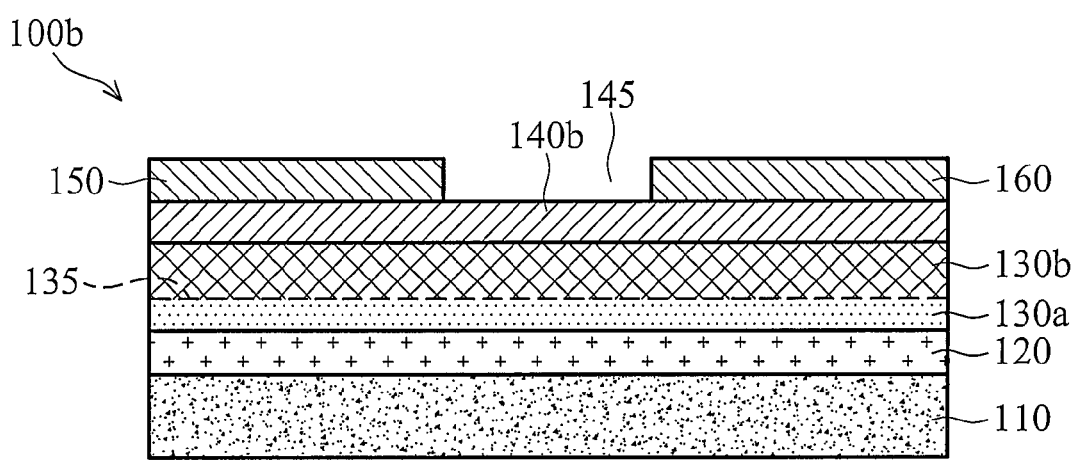

FIGS. 3A-3B are cross sections of an embodiment of OTFT devices of the invention. Referring to FIG. 3A, a top contact OTFT device 100a comprises a substrate 110. A first electrode layer 120 is disposed on the substrate 110 to serve as a gate electrode. A hybrid multi-layered structure comprises a first dielectric layer 130a and a second dielectric layer 130b disposed on the substrate 110, wherein the first dielectric layer and the second dielectric layer are solvable and substantially without an interface therebetween (as shown as pseudo-interface 135). A second electrode layer comprising a source region 150 and a drain region 160 are separated from each other. A patterned semiconductor layer 140a is disposed on the second dielectric layer 130b to serve as an activation layer of the top contact OTFT device 100a, where both ends of the semiconductor layer 140a are partly covered by the source region 150 and the drain region 160, respectively. Furthermore, the source region 150 and the drain region 160 are separated by a predetermined distance 145.

The semiconductor layers of the top contact OTFT device of the invention are not limited to the aforementioned pattern. For example, referring to FIG. 3B, a top contact OTFT device 100b comprises a substrate 110. A first electrode layer 120 is disposed on the substrate 110 to serve as a gate electrode. A hybrid multi-layered structure comprises a first dielectric layer 130a and a second dielectric layer 130b disposed on the substrate 110, wherein the first dielectric layer and the second dielectric layer are solvable and substantially without an interface therebetween (as shown as pseudo-interface 135). A second electrode layer comprising a source region 150 and a drain region 160 are separated from each other. A semiconductor layer 140b is entirely formed on the second dielectric layer 130b to serve as an activation layer of the top contact OTFT device 100b, wherein the source region 150 and the drain region 160 are separated by a predetermined distance 145 and disposed on the semiconductor layer 140b. Note that when the OTFT devices are applied to an active matrix substrate of display devices, the semiconductor layers of each OTFT device can be separated from each other.

Figure 3C:
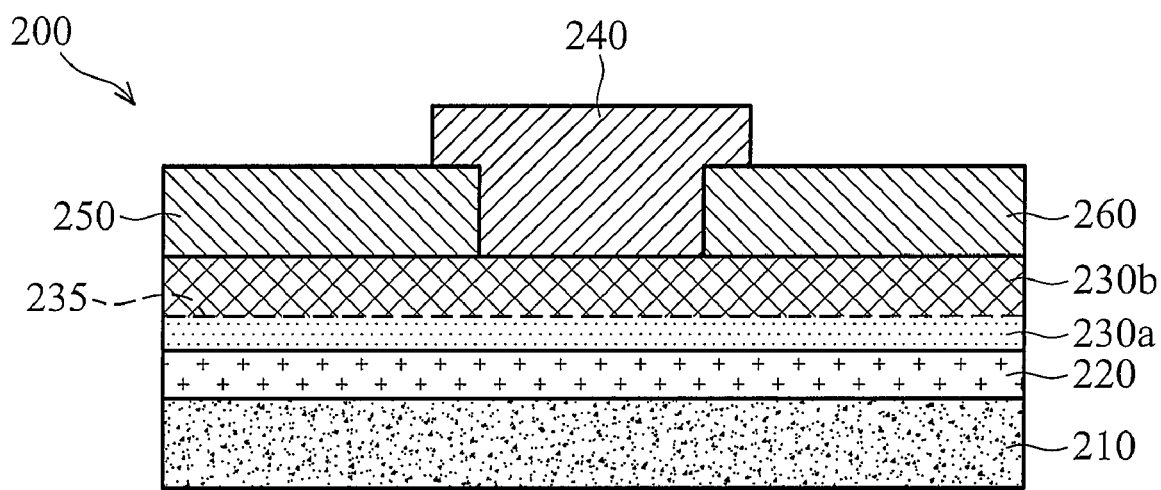
FIG. 3C is cross sections of an exemplary embodiment of a bottom contact OTFT device of the invention.

FIG. 3C is a cross sections of an embodiment of a bottom contact OTFT device of the invention. Referring to FIG. 3C, a bottom contact OTFT device 200 comprises a substrate 210. A first electrode layer 220 is disposed on the substrate 210 to serve as a gate electrode. A hybrid multi-layered structure comprises a first dielectric layer 230a and a second dielectric layer 230b disposed on the substrate 210, wherein the first dielectric layer and the second dielectric layer are solvable and substantially without an interface therebetween (as shown as pseudo-interface 235). A second electrode layer comprising a source region 250 and a drain region 260 are separated from each other. A semiconductor layer 240 is disposed on the second dielectric layer 230b to serve as an activation layer of the bottom contact OTFT device 200, where opposite ends of the source region 250 and the drain region 260 are covered by the semiconductor layer 240.

According to some embodiments of the invention, the first dielectric layer comprises a high dielectric constant (high-k) dielectric material having an organic/inorganic hybrid material with a combination of high-k nano-particles and a photosensitive and/or a non-photosensitive polymer matrix. The high-k nano-particles comprise metal oxide nano-particles, ferroelectric insulation nano-particles, or combinations thereof. For example, the metal oxide nano-particles comprise $Al_2O_3$, $TiO_2$, $ZrO_2$, $Ta_2O_5$, $SiO_2$, $BaO$, $HfO_2$, $GeO_2$, $Y_2O_3$, $CeO_2$, or combinations thereof. Furthermore, the ferroelectric insulation nano-particles comprise $BaTiO_3$, $SrTiO_3$, $Bi_4Ti_3O_{12}$, $(Ba_xSr_{1-x})TiO_3$, $(Ba_xZr_{1-x})TiO_3$, $(Pb_xZr_{1-x})TiO_3$, or combinations thereof.

The photosensitive and/or non-photosensitive polymer matrix comprises polyimide, polyamide, polyvinyl alcohol, polyvinyl phenol, polyacrylate (PA), epoxide, polyurethane, fluoropolymer, polysiloxane, polyester, polyacrylonitrile, polystyrene, or polyethylene. The second dielectric layer is formed by a solution process on the first dielectric layer such that an invisible interface substantially exists between the first and the second dielectric layers. More specifically, the solution process comprises directly forming a patterned structure. For example, the step of directly forming a patterned structure may comprise slot die coating, flexographic coating, inkjet printing, microcontact printing, nanoimprinting, or screen printing. Alternatively, the solution process comprises forming a thin film, and then patterning it. For example, the step of forming the thin film may comprise spin coating, slot die coating, dip coating, or spraying, while the thin film may be patterned by lithography, etching, or laser ablation. Note that the second dielectric layer is soluble with the first dielectric layer, wherein the polymer material of the second dielectric layer and the first dielectric layer can be of the same polymer material or selected from different polymer materials. Alternatively, the second dielectric layer and the first dielectric layer can be formed by different fabrication processes. As a result, the high-k nano-particles in the first dielectric layer are evenly dispensed to the second dielectric layer, resulting in a smooth surface and uniform thickness of the second dielectric layer. Since the high-k nano-particles are evenly distributed in both the first and the second dielectric layers, the dielectric constant of the hybrid multi-layered structure can thus increase, ameliorating electric performance of electronic devices.

Figure 4:
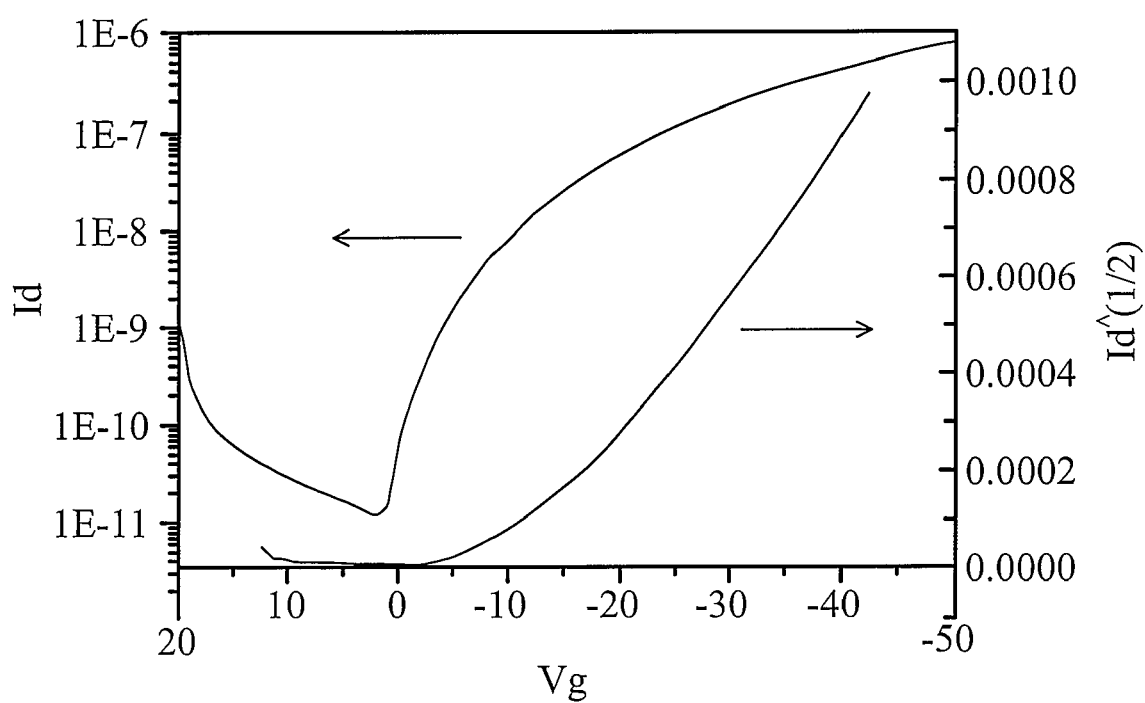
FIG. 4 shows the electrical performance of the bottom contact OTFT device of the invention

FIG. 4 shows electric performance of the bottom contact OTFT device of the invention. Referring to FIG. 4, the on/off ratio of the OTFT device is approximately $10^5$. Carrier mobility of the OTFT device is approximately 0.075 $cm^2/Vs$. Threshold voltage of the OTFT device is approximately −9V. The dielectric constant of the OTFT device calculated from the capacitance-voltage (C–V) relation is approximately $\geq 7$.

Figure 5A:
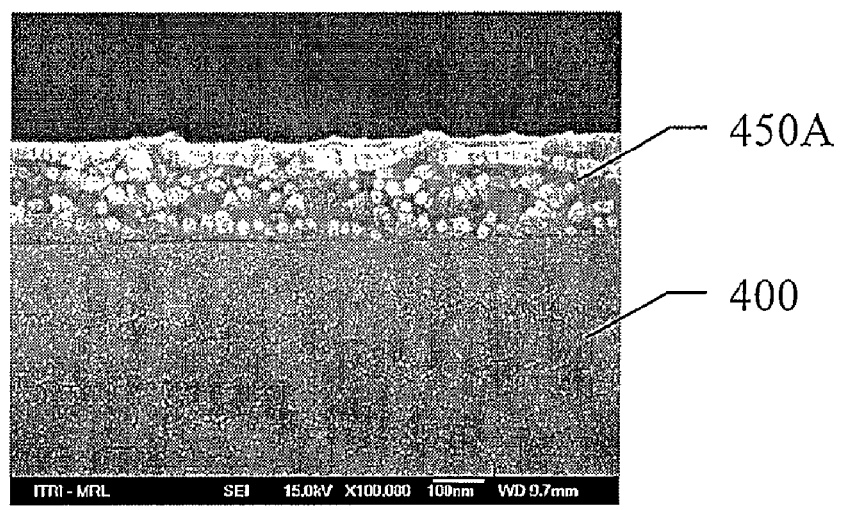
FIG. 5A is a scanning electron microscope (SEM) cross section image illustrating the first dielectric layer formed on the substrate.

FIG. 5A is a scanning electron microscope (SEM) cross section image illustrating the first dielectric layer formed on the substrate. Referring to FIG. 5A, the first dielectric layer 450A is a high dielectric constant (high-k) dielectric material comprising an organic/inorganic hybrid material with a combination of high-k nano-particles and a photosensitive and/or a non-photosensitive polymer matrix. The first dielectric layer 450A is formed by a solution process on the substrate 400 resulting in a rough surface.

Figure 5B:
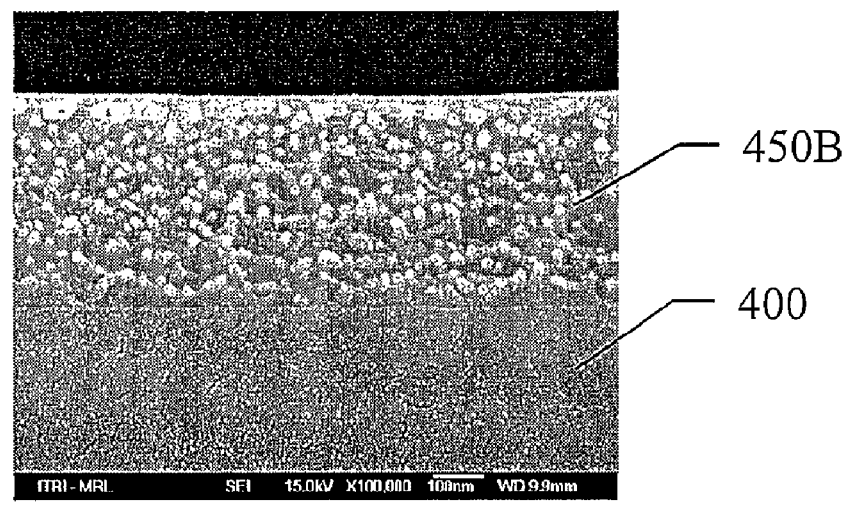
FIG. 5B is a scanning electron microscope (SEM) cross section image illustrating the second dielectric layer formed on the first dielectric layer.

FIG. 5B is a scanning electron microscope (SEM) cross section image illustrating the second dielectric layer formed on the first dielectric layer. Referring to FIG. 5B, the second dielectric layer is selected from materials soluble to the first dielectric layer. After the second dielectric layer is formed by a solution process on the first dielectric layer such that an organic/inorganic hybrid high-k dielectric layer 450B with an invisible interface is formed, the high-k nano-particles are evenly distributed in the organic/inorganic hybrid high-k dielectric layer. With the dielectric constant of the hybrid multi-layered structure increased, electric performance of electronic devices are ameliorated.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with hybrid high-k dielectric, comprising:
   a substrate;
   a first electrode disposed on the substrate;
   a hybrid dielectric structure comprising a first part of dielectric layer and a second part of dielectric layer disposed on the substrate, wherein the first part of dielectric layer and the second part of dielectric layer are solvable with each other and substantially without an interface therebetween; and
   a second electrode disposed on the hybrid dielectric structure,
   wherein the first part of dielectric layer comprises a high dielectric constant (high-k) dielectric material comprising an organic/inorganic hybrid material with a combination of high-k nano-particles and a photosensitive and/or a non-photosensitive polymer matrix.

2. The electronic device as claimed in claim 1, wherein the electronic device comprises a field effect transistor, an organic thin film transistor (OTFT), an inorganic thin film transistor, or a metal-insulator-metal (MIM) capacitor.

3. The electronic device as claimed in claim 2, wherein the OTFT comprises a top contact transistor structure, wherein the second electrode comprises distanced source and drain regions and a semiconductor layer serves as an activation layer of the OTFT, and wherein the semiconductor layer is covered by the distanced source and drain regions.

4. The electronic device as claimed in claim 2, wherein the OTFT comprises a bottom contact transistor structure, wherein the second electrode comprises distanced source and drain regions and a semiconductor layer serves as an activation layer of the OTFT, and wherein the distanced source and drain regions are partly covered by the semiconductor layer.

5. The electronic device as claimed in claim 1, wherein the high-k nano-particles comprise metal oxide nano-particles, ferroelectric insulation nano-particles, or combinations thereof.

6. The electronic device as claimed in claim 5, wherein the metal oxide nano-particles comprise $Al_2O_3$, $TiO_2$, $ZrO_2$, $Ta_2O_5$, $SiO_2$, $BaO$, $HfO_2$, $GeO_2$, $Y_2O_3$, $CeO_2$, or combinations thereof.

7. The electronic device as claimed in claim 5, wherein the ferroelectric insulation nano-particles comprise $BaTiO_3$, $SrTiO_3$, $Bi_4Ti_3O_{12}$, $(Ba_xSr_{1-x})TiO_3$, $(Ba_xZr_{1-x})TiO_3$, $(Pb_xZr_{1-x})TiO_3$, or combinations thereof.

8. The electronic device as claimed in claim 1, wherein the photosensitive and/or non-photosensitive polymer matrix comprises polyimide, polyamide, polyvinyl alcohol, polyvinyl phenol, polyacrylate (PA), epoxide, polyurethane, fluoropolymer, polysiloxane, polyester, polyacrylonitrile, polystyrene, or polyethylene.

9. The electronic device as claimed in claim 1, wherein the second part of dielectric layer is soluble to the first part of dielectric layer, and wherein the second part of dielectric layer and the first part of dielectric layer are of the same polymer material.

10. The electronic device as claimed in claim 1, wherein the second part of dielectric layer is soluble to the first part of dielectric layer, and wherein the second part of dielectric layer and the first part of dielectric layer are of different polymer materials.

11. The electronic device as claimed in claim 1, wherein the second part of dielectric layer is formed by a solution process on the first part of dielectric layer such that an invisible interface substantially exists between the first and the second part of dielectric layers.

* * * * *